United States Patent [19]

Takasu

[11] Patent Number: 5,442,222

[45] Date of Patent: * Aug. 15, 1995

[54] METHOD FOR MANUFACTURING SEMICONDUCTOR DEVICE HAVING GROWN LAYER ON INSULATING LAYER

[75] Inventor: Hidemi Takasu, Kyoto, Japan

[73] Assignee: Rohm Co., Ltd., Kyoto, Japan

[*] Notice: The portion of the term of this patent subsequent to Apr. 4, 2012 has been disclaimed.

[21] Appl. No.: 188,352

[22] Filed: Jan. 28, 1994

Related U.S. Application Data

[63] Continuation of Ser. No. 788,636, Nov. 6, 1991, abandoned.

[30] Foreign Application Priority Data

Jul. 26, 1991 [JP] Japan .................. 3-187619

[51] Int. Cl.⁶ ..................... H01L 27/12; H01L 27/02
[52] U.S. Cl. .................. 257/506; 257/510; 257/74; 257/374
[58] Field of Search ............. 257/506, 510, 374, 74

[56] References Cited

U.S. PATENT DOCUMENTS 5,040,043 8/1991 Ohno et al. ................... 257/506

OTHER PUBLICATIONS

"The Effect of Polishing Conditions on the SOI Devices Adhered On Polyimide Layer", S. Takahashi et al, Preliminary Bulletin for the Fall Academic Lecture 1991, by the Applied Physics Society, 9a-C-6, p. 619.
"Tunnel Epitaxy III", Atsushi Ogura et al, Preliminary Bulletin for the Fall Academic Lecture 1991, by the Applied Physics Society, 9p-C-3, p. 622.
"Performance of SOIMOSFETs Fabricated in High Quality Laser-Recrystallized SOI", Y. Inoue et al, Preliminary Bulletin for the Fall Academic Lecture 1991, Applied Physics Society, 11a-SF-21, p. 742.
"Lateral Epitaxial Overgrowth of Silicon on SiO₂" by D. D. Rathman et al, Journal of Electrochemcial Society Solid-State Science and Technology, Oct., 1982, pp. 2303-2306.
"New SOI-Selective Nucleation Epitaxy", by Ryudai Yonehara et al, Preliminary Bulletin for the 48th Fall Academic Lecture 1987, by the Applied Physics Society, 19p-Q-15, p. 583.

Primary Examiner—Gene M. Munson
Attorney, Agent, or Firm—Lowe, Price, LeBlanc & Becker

[57] ABSTRACT

The present invention provides a semiconductor device by forming an epitaxial layer (22) insulated from a silicon substrate (2), and forming a device in the epitaxial layer (22). On the semiconductor substrate (2), a silicon dioxide layer (4) is formed (FIG. 2 A). Then the silicon dioxide layer (4) is provided with openings (14) (FIG. 2 D). Silicon is made to grow until it protrudes from the openings (14) to thereby form a silicon seed crystal layer (16) (FIG. 2 E). Next, a silicon nitride layer (18) is formed on the surface of the silicon seed crystal layer (16) and thereafter is oxidized. A field oxide layer (20) is thereby bonded at the lower portion of the openings (14), the silicon seed crystal layer (16) being insulated from the silicon substrate (2). Thereafter, epitaxial growth is effected from the silicon seed crystal layer (16). The growth is stopped just before silicon grown layers (22) connect to one another, thus obtaining epitaxially grown layers (22) having regions which are separate from one another. The device is formed in the epitaxially grown layer (22). The silicon grown layer (22) is isolated from the silicon substrate (2) and has the uniform plane bearing, thus allowing no electrostatic capacitance to be caused due to pn junction with the silicon substrate (2) and high-speed operation to be realized. Moreover, the unique plane bearing facilitates control during the manufacturing process.

2 Claims, 10 Drawing Sheets

METHOD FOR MANUFACTURING SEMICONDUCTOR DEVICE HAVING GROWN LAYER ON INSULATING LAYER

This application is a continuation of application Ser. No. 07/788,636, filed Nov. 6, 1991, now abandoned.

BACKGROUND OF THE INVENTION

1. Field of the Invention

The present invention relates to methods for manufacturing semiconductor devices and, more particularly, to a method for manufacturing structures having a semiconductor layer on an insulating layer 2. Description of the Prior Art Semiconductor microchips or integrated circuits in general are provided in a structure in which an epitaxially grown layer is formed on a silicon substrate and circuits are then formed in the epitaxially grown layer. The silicon substrate and the epitaxially grown layer are joined together to form a pn junction. The resulting capacitance of the pn junction, however, is such that it reduces the operating speed of the device. Accordingly, this structure was not suitable for forming devices requiring high-speed operation.

In the last few years, to solve this problem, a way of forming an additional silicon monocrystal layer to overlie the insulating layer on the silicon substrate (Semiconductor on Insulator, or SOI, technique) has been sought. This is to eliminate the pn junction between the semiconductor device formed on the silicon monocrystal layer and the silicon substrate, by insulating the silicon monocrystal layer from the silicon substrate.

FIG. 1 illustrates the conventional SOI technique using the ELO (Epitaxial Lateral Overgrowth) method ("Lateral Epitaxial Overgrowth of Silicon on SiO$_2$," by D. D. Rathman et. al., JOURNAL OF ELECTRO-CHEMICAL SOCIETY SOLID-STATE SCIENCE AND TECHNOLOGY, October, 1982, p. 2303). First, a silicon dioxide layer 4 is grown on top of a semiconductor substrate 2. Then, the silicon dioxide layer 4 is etched using photoresist to thereby open seed windows 6 (see FIG. 1A). This is followed by selective epitaxial growth of silicon in the longitudinal direction from the seed windows 6, and, subsequently, lateral epitaxial growth, to form an epitaxial layer 8 on the silicon dioxide layer 4 (see FIG. 1B). By these processes, the pn junction between the epitaxial layer 8 and the silicon substrate 2 can be reduced in area to the size of the seed window 6, thus allowing the pn junction capacitance to be reduced and high-speed operation of the device to be realized.

Another method available is the SENTAXY method ("New SOI-Selective Nucleation Epitaxy," by Ryudai Yonehara et. al., Preliminary Bulletin for the 48th Fall Academic Lecture 1987 by the Applied Physics Society, 19p-Q-15, p. 583). In this method, a plurality of crystal-grown silicon nuclei are formed on an insulating layer of silicon dioxide or the like, further effecting epitaxial growth from each of the nuclei. Methods of forming the nuclei which are under discussion include formation of a small-area silicon nitride layer composed of the nuclei, or employment of the FIB (Focused Ion Beam) method. Using this method allows the epitaxial layer and the silicon substrate to be isolated from one another by an oxide layer, which will solve the aforementioned problems.

However, the conventional SOI technique described above would involve the following problem.

In the ELO method shown in FIG. 1, the junction, although reduced indeed, is not wholly eliminated. This would arrest further increase of the operating speed of the device.

In the SENTAXY method, on the other hand, the epitaxial layer and the silicon substrate are isolated from one another, thus overcoming the above problem. However, the SENTAXY method involves differentiation in the plane bearing of the epitaxial layer that grows from each of the nuclei. This differentiation in the plane bearing of the epitaxial layer will cause variation in oxidation rate and other characteristics, with the result that a device having desired characteristics cannot be formed uniformly.

SUMMARY OF THE INVENTION

An object of the present invention, therefore, is to overcome the aforementioned problems and provide a semiconductor device having a silicon grown layer which is isolated from the substrate by an insulating layer and uniform in plane bearing.

A method for manufacturing a semiconductor device having a grown layer on an insulating layer in accordance with an embodiment of the present invention, comprises:

an insulating layer formation step of forming an oxide insulating layer on a silicon substrate;

an opening formation step of providing the oxide insulating layer with an opening for seed crystal growth;

a seed crystal growth step of effecting crystal growth until the silicon seed crystal layer protrudes slightly from the opening with the oxide insulating layer used as a mask;

a barrier formation step of forming a barrier layer on the protruding surface of the silicon seed crystal, the barrier layer having an oxidation rate sufficiently low as compared with that of the applicable silicon seed crystal layer;

a selective oxidation step of effecting oxidation with the barrier layer used as a barrier to oxidize the silicon seed crystal layer within the opening, thereby cutting off the connection between the silicon seed crystal layer and the silicon substrate;

a barrier removal step of making the silicon seed crystal layer exposed by removing the barrier layer;

a silicon growth step of subjecting the silicon grown layer to crystal growth on the basis of the silicon seed crystal layer to thereby obtain regions of the the silicon grown layer separated from one another; and a device formation step of forming a semiconductor device on the silicon grown layer.

A method for manufacturing a semiconductor device in accordance with another embodiment of the invention, comprises:

an insulating layer formation step of forming an oxide insulating layer on a silicon substrate;

an opening formation step of providing the oxide insulating layer with an opening for seed crystal growth;

a seed crystal growth step of effecting crystal growth until the silicon seed crystal layer protrudes slightly from the opening with the oxide insulating layer used as a mask;

an oxidation step of effecting oxidation to oxidize the silicon seed crystal layer within the opening with the seed crystal layer remaining in a quantity required for crystal growth, thereby cutting off the connection between the silicon seed crystal layer and the silicon substrate;

a silicon growth step of subjecting the silicon grown layer to crystal growth on the basis of the silicon seed crystal layer to thereby obtain the silicon grown layer separated from one another; and a device formation step of forming a semiconductor device on the silicon grown layer.

While the novel features of the invention are set forth in a general fashion, particularly in the appended claims, the invention, both as to organization and content, will be better understood and appreciated, along with other objects and features thereof, from the following detailed description taken in conjunction with the drawings.

DESCRIPTION OF THE PREFERRED EMBODIMENT

Figure 1:
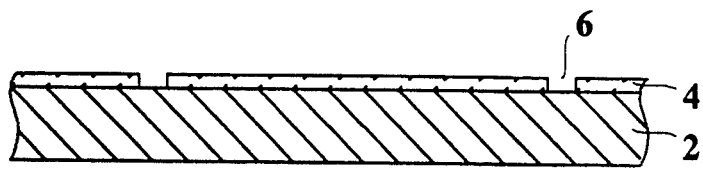
FIGS. 1A and 1B are views illustrating the conventional SOI (Semiconductor on Insulator) technique using the ELO (Epitaxial Lateral Overgrowth) method.
Figure 1:
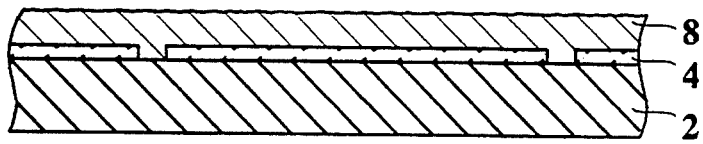

A method for manufacturing a semiconductor device according to an embodiment of the present invention is shown in FIG. 2. First, a silicon substrate 2 is placed in an oxygen atmosphere with temperature increased to high, thereby thermally oxidizing the substrate surface. As a result, a silicon dioxide layer 4 ($SiO_2$), serving as an oxide insulating layer, is formed on the top of the silicon substrate 2, as shown in FIG. 2A. Preferably, the silicon dioxide layer 4 is formed so as to be thin, for example, approximately 30 to 300 nm thick. Next, as shown in FIG. 2B, photoresist 10 is applied onto the silicon dioxide layer 4. After a mask is placed on the photoresist 10 and exposed to ultraviolet rays, openings 12 are formed as shown in FIG. 2C. In this state, with the photoresist 10 used as a mask, the silicon dioxide layer 4 is subjected to etching. Subsequently, the photoresist 10 is removed by use of a mixed liquid of sulfuric acid and hydrogen peroxide. Thus, openings 14 for seed crystal growth are formed, as shown in FIG. 2D. The width of the openings 14 is less than 2 μm.

Figure 2A:
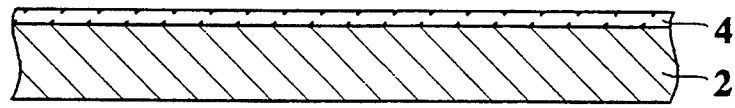
FIGS. 2A to 2F are views illustrating a method for manufacturing a semiconducter device which is an embodiment of the present invention.
Figure 2B:
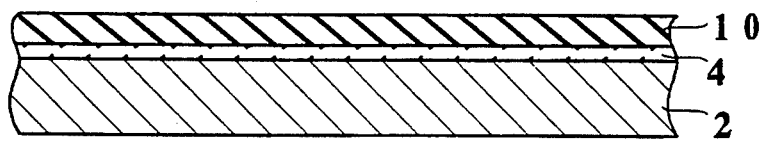
Figure 2C:
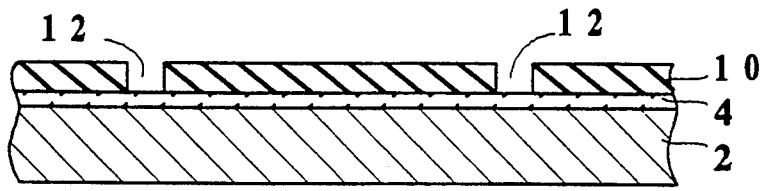
Figure 2D:
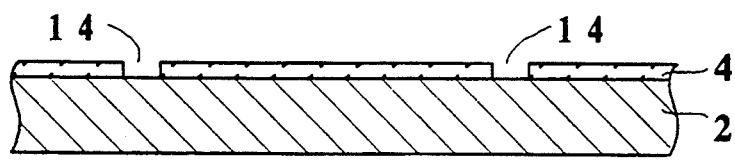
Figure 2E:
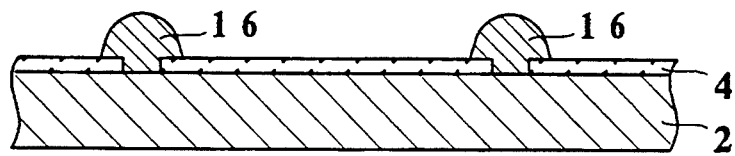

In the step shown in FIG. 2D, the openings 14 are selectively subjected to epitaxial growth of silicon monocrystal, so that seed crystal layers 16 are formed as shown in FIG. 2E. The epitaxial growth at this step is controlled so as to suppress lateral growth. The longitudinal growth is allowed to range approximately 1 to 4 μm, while the lateral growth is suppressed to remain within 1 μm.

During growth of the seed crystal layer 16, there may arise stacking faults at the interface with the silicon dioxide layer 4. Due to this, the layer 4 of silicon dioxide is formed thin so as to reduce the interface area, as described above, to prevent stacking faults. Further, the epitaxial growth is preferably carried out at as low a temperature as possible, within the approximate range of 900° C. to 1100° C.; epitaxial growth carried out at such a low temperature will enable stacking faults to be suppressed. Moreover, when the silicon dioxide layer 4 is formed to a silicon substrate (100) in a rectangular pattern in the direction of <100>, stacking faults can be further suppressed. And still further, when a thin polysilicon or nitride silicon layer is added to the sidewall of the silicon dioxide layer 4 prior to the growth in order to improve the lattice consistency, the crystal faults can also be suppressed. Each of the seed crystal layers 16 formed by the above steps has the same plane bearing or crystal plane orientation.

Figure 2F:
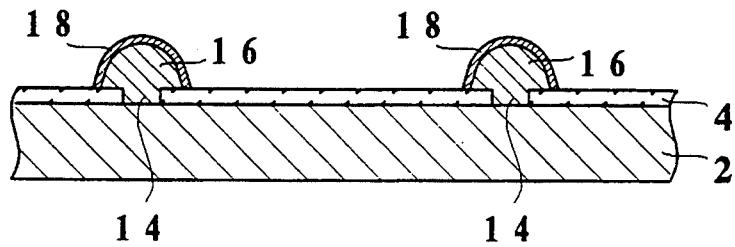
Figure 3A:
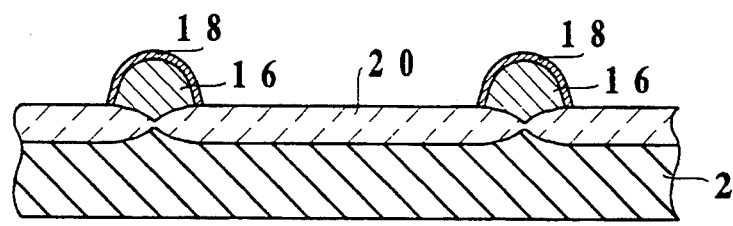
FIGS. 3A to 3C are other views illustrating a method for manufacturing a semiconductor device which is another embodiment of the present invention.

Next, as shown in FIG. 2F, the surface of the seed crystal layer 16 is nitrified to form silicon nitride layers 18 ($Si_3N_4$) as barrier layers. Oxidation-treatment follows this, thereby oxidizing the silicon dioxide layer 4 and the silicon substrate 2. In this treatment, the silicon nitride layer 18 functions to block the oxidation, preventing oxidation of the seed crystal layer 16. Meanwhile, the silicon dioxide layer 4 is oxidized to grow into a field oxide layer 20. The field oxide layer 20 also grows laterally at its ends forming a Bird's Beak structure which is defined by the tapered connection which forms between adjacent ends of the field oxide layer and beneath the seed crystal layer as shown in FIG. 3A. In addition, as described earlier, the width of the openings 14 is as narrow as 2 μm or less. Accordingly, as shown in FIG. 3A, the field oxide layer 20 is connected with the seed crystal layer 16 at its lower portion.

Figure 3B:
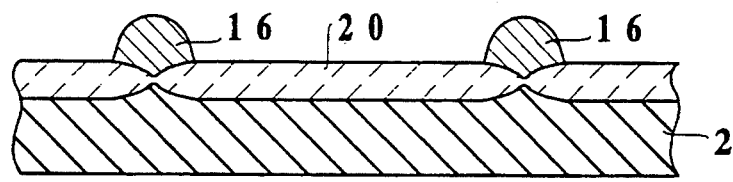

Subsequently, only the oxidized layer of the silicon nitride layer 18 is eliminated by flash-etch and so on, and then etching is performed using high-temperature phosphoric acid or the like to remove the silicon nitride layer 18 (see FIG. 3B). Thereafter, epitaxial growth is effected with the seed crystal layers 16 used as the seed crystal. The epitaxial growth at this step is controlled so as to increase lateral growth. As the growth continues, the grown layers out of each seed crystal layer 16 come to be connected to one another, resulting in the structure shown in FIG. 3C.

Each epitaxially grown layer 22, which is a silicon grown layer, is isolated from the silicon substrate 2 by the field oxide layer 20. Accordingly, it generates no electrostatic capacitance due to the pn junction with the silicon substrate 2. This means that forming devices (e.g. transistors, FETs) in each epitaxially grown layer 22 will not cause any reduction in operating speed due to electrostatic capacitance, allowing a high-speed device to be realized. Moreover, since no electrostatic capacitance is caused due to the pn junction, a good high-frequency characteristic and an enhanced latch-up characteristic can be obtained.

Further, each epitaxially grown layer 22 is not connected to one another, thus allowing no electrostatic capacitance to be caused by the pn junction between the layers 22.

In addition, the plane bearing or crystal plane orientation of each seed crystal layer 16 is uniform and therefore that of the epitaxially grown layer 22 is also uniform. Accordingly, the oxidation rate is uniform, facilitating the control of device characteristics when forming devices in the epitaxially grown layer 22.

In this embodiment, the surface of the seed crystal layer 16 is nitrified to form the silicon nitride layer 18 and thereafter is oxidized. However, it may also be arranged that, subsequent to forming the silicon nitride layer 18, the silicon dioxide layer 4 is removed by etching and thereafter oxidation is effected. In this case, to make the seed crystal grown layer 16 in the opening 14, it is not necessary to suppress lateral growth.

Figure 4:
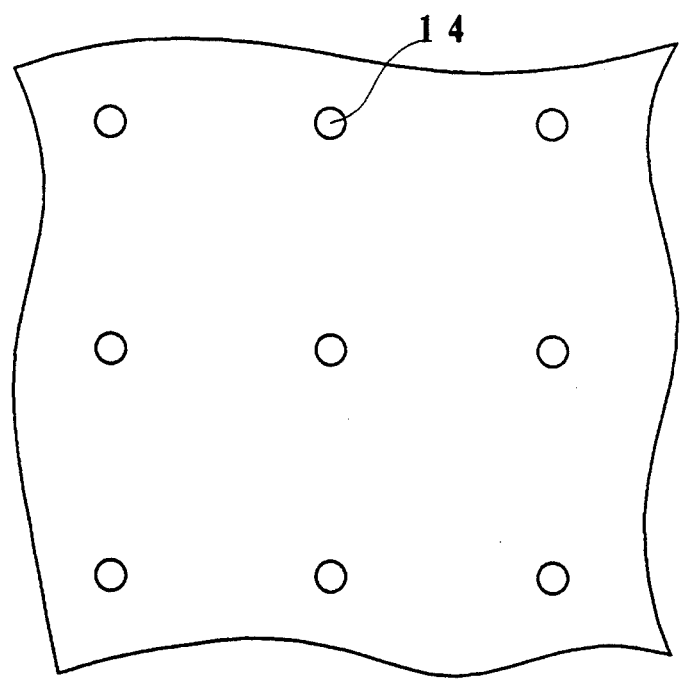
FIG. 4 is a view illustrating an example of the opening 14 provided in the oxide insulating layer 4 shown in FIG. 2D.
Figure 5:
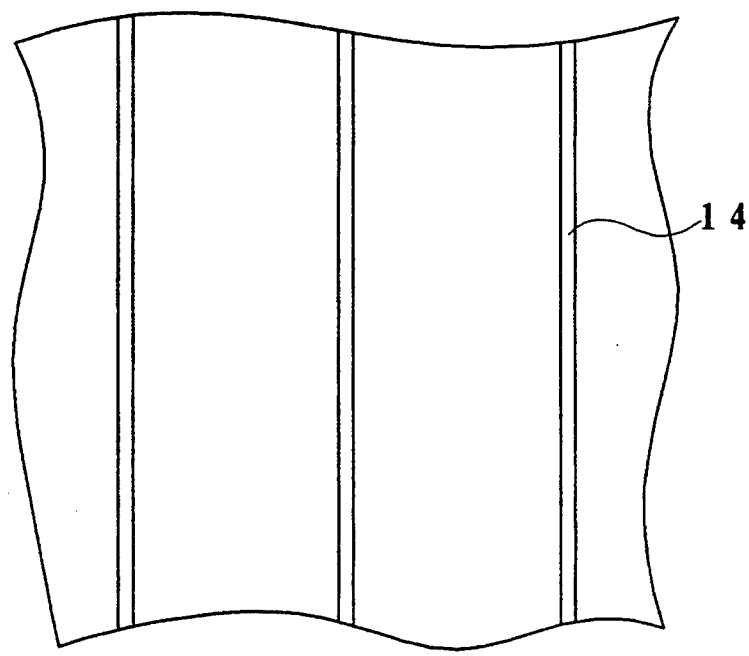
FIG. 5 is a view illustrating another example of the opening 14 provided in the oxide insulating layer 4.

Further, the form of the openings 14 may be selected as appropriate to the required epitaxially grown layer 22. For example, they may be in the form of holes as shown in FIG. 4, or of straight lines as shown in FIG. 5. It may further be preferable that the direction of patterning the silicon dioxide layer 4 be <100>, which can prevent the occurrence of all faults.

Figure 3C:
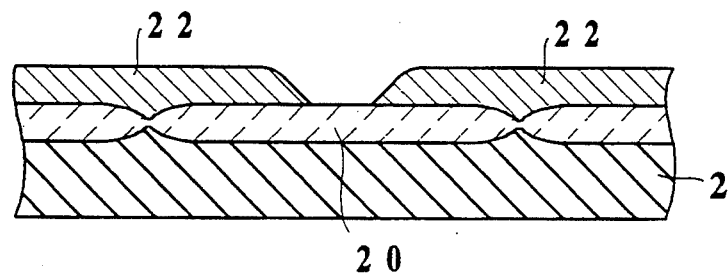

Moreover, when the steps shown in FIGS. 2 and 3 are added after the formation of devices in the epitaxially grown layer 22 in FIG. 3C, integrated circuits can be formed in a three-dimensional structure.

Further, in the above embodiment, the surface of the seed crystal layer 16 is nitrified, at the step shown in FIG. 2F, to form the silicon nitride layer 18. However, this step may be substituted for by depositing a nitride layer using the CVD (Chemical Vapor Deposition) method or the like.

In addition, the silicon nitride layer 18 may be substituted for by another material having a sufficiently low oxidation rate as compared with that of silicon. Silicon carbide, for example, or the like may be preferable.

Figure 13:
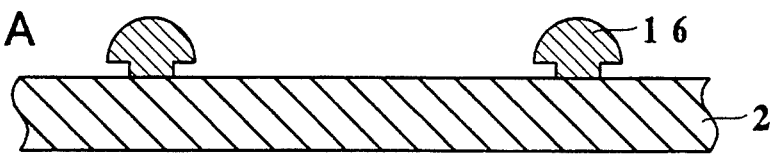
FIGS. 13A to 13D are views illustrating a method for manufacturing a semiconductor device which is another embodiment of the present invention.
Figure 13:
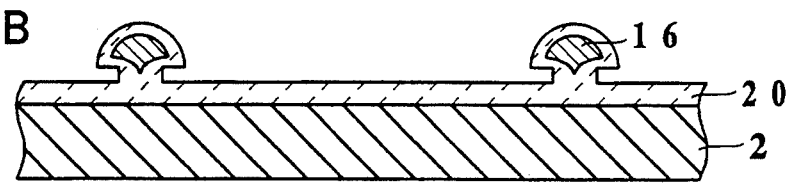
Figure 13:
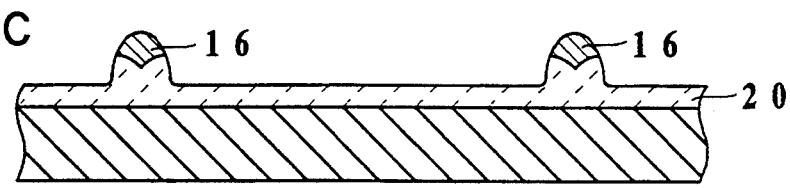
Figure 13:
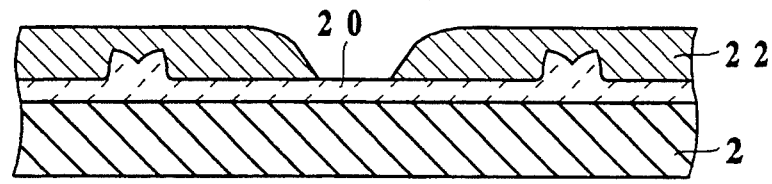

In this embodiment the silicon nitride layer 18 is formed on the seed crystal layer 16. However, when the thickness of the seed crystal layer 16 is sufficient, it is not necessary to form the silicon nitride layer 18. The steps for the case where the silicon nitride layer 18 is not formed are shown in FIG. 13. They are the same as those of FIGS. 2A through 2E extending to the point where the seed crystal layer 16 is made to grow in the opening 14. After the step shown in FIG. 2E, the silicon dioxide layer 4 is removed by etching. This step allows the silicon seed crystal layer 16 to remain in a mushroom shape as shown in FIG. 13A. Then oxidation is carried out, so that the thinned portion of the silicon seed crystal layer 16 at its lower side is completely oxidized, into the state shown in FIG. 13B. This is followed by removing the oxidized layer on the top of the silicon seed crystal layer 16, into the state shown in FIG. 13C. Further, epitaxial growth is effected on the basis of the silicon seed crystal layer 16, with the result shown in FIG. 13D.

In the method shown in FIG. 13, formation of the silicon nitride layer 18 is not required, simplifying the processes involved.

Figure 6A:
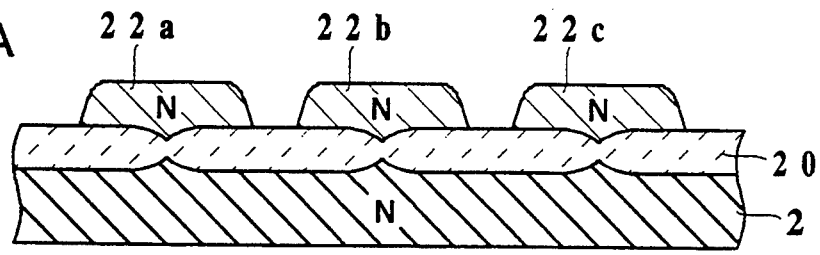
FIGS. 6A to 6D are views illustrating a method for manufacturing FETs which is an embodiment of the present invention.
Figure 6B:
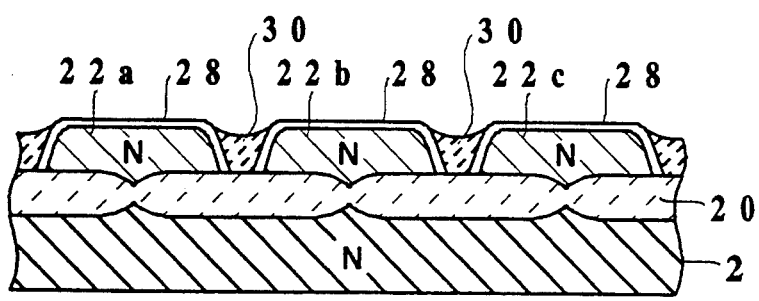

Next, steps to form P-channel FETs and N-channel FETs in the epitaxially grown layer 22 formed through steps shown in FIGS. 2, 3 and/or 13 will be explained hereinafter. Epitaxially grown layers 22a, 22b and 22c are first formed on the field oxide layer 20 as shown in FIG. 6A. The surface thereof is then oxidized to grow the silicon dioxide layer 28. Further, the silicon dioxide 30 is made to grow in regions between epitaxially grown layers 22a, 22b and 22c by either SOG (Spin on Glass) or CVD (Chemical Vapor Deposition), and thereafter is flattened by etchback (see FIG. 6B).

Figure 6C:
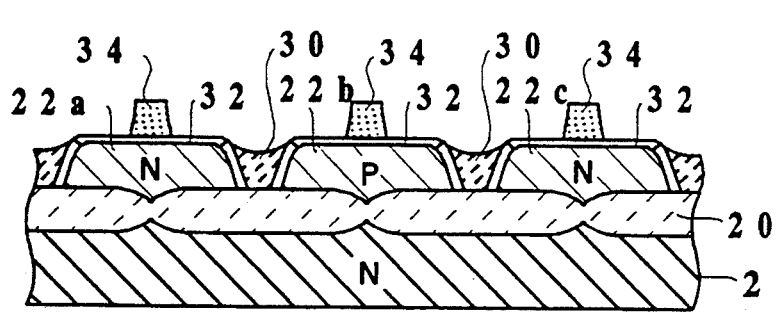

Only the epitaxially grown layer 22b is next subjected to an ion implant step, wherein boron ions are implanted by use of resist and then diffused, allowing the portion involved to be converted to P-type. The silicon dioxide layer 28 is removed by flash-etch (mild etching with hydrogen fluoride), so that the top surface of each epitaxially grown layer comes to be exposed. This is followed by the formation of gate oxide layer 32 on the top of each exposed epitaxially grown layer 22a, 22b and 22c, and then polysilicon gate 34 is produced thereon by photo-etching as seen in FIG. 6C.

Figure 6D:
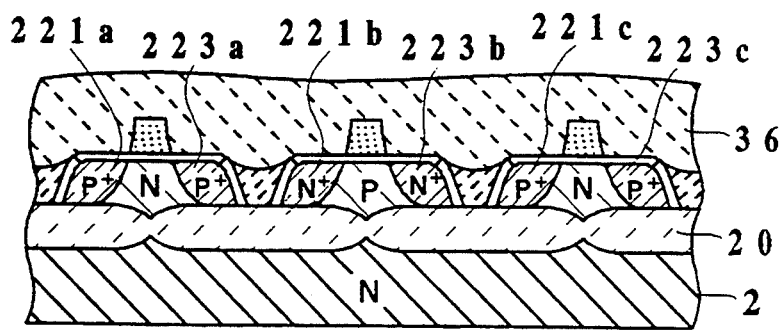

Subsequently, boron ions are implanted only into epitaxially grown layers 22a and 22c by use of resist, while arsenic ions are implanted into the epitaxially grown layer 22b in a similiar manner. Thereafter, the insulating layer 36 is deposited to cover all the surface. Then, after etchback is performed to flatten the layer, annealing is effected so that the implanted ions are made to diffuse as shown in FIG. 6D. Obviously, source regions 221a, 221b and 221c and drain regions 223a, 223b and 224c come to be created by ion diffusion. Incidentally, each grown layer 22a, 22b and 22c has the same plane bearing, thus allowing the diffusion to be controled unifomly during the ion diffusion.

Figure 7:
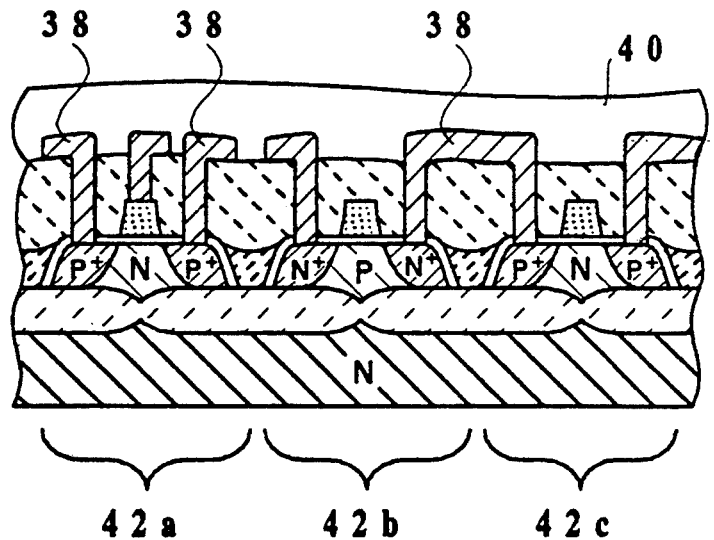
FIG. 7 is a view illustrating structures of FETs obtained by the steps shown in FIG. 6.

Next, connection is made by wiring 38 with aluminum or the like and thereafter protective coat 40 is formed by means of passivation as shown in FIG. 7, completing the series of process. By these process, P-channel FETs 42a and 42c and N-channel FET 42b are formed.

In the above embodiment, a FET is manufactured as a device. However a FET may be substituted for by another device.

Figure 8:
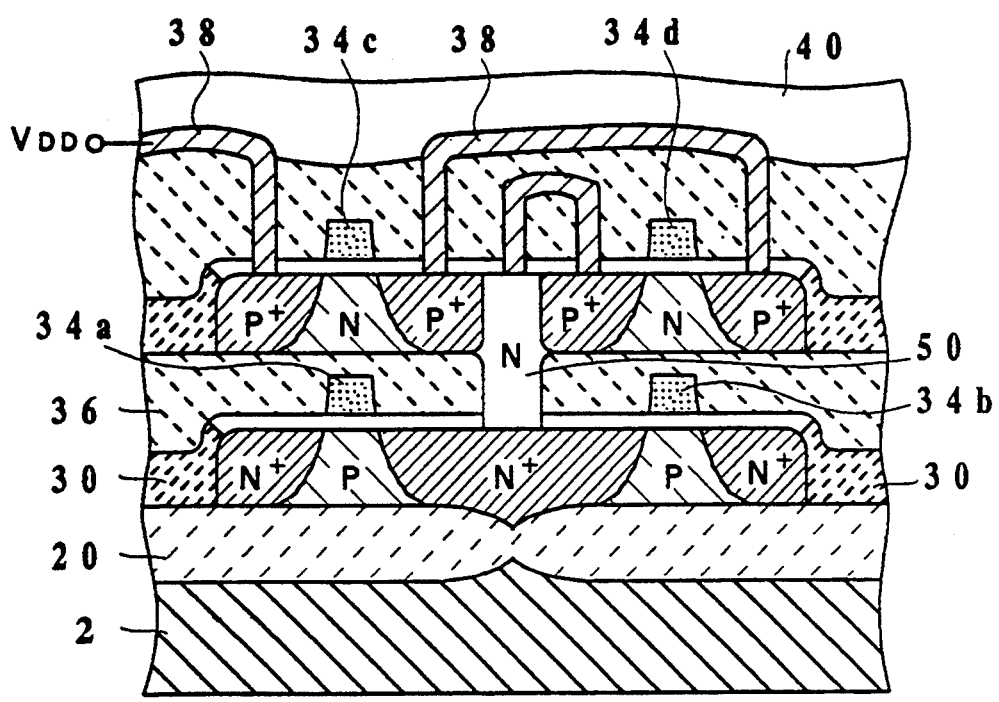
FIG. 8 is a view illustrating a semiconductor device formed in a two-layer structure.
Figure 9:
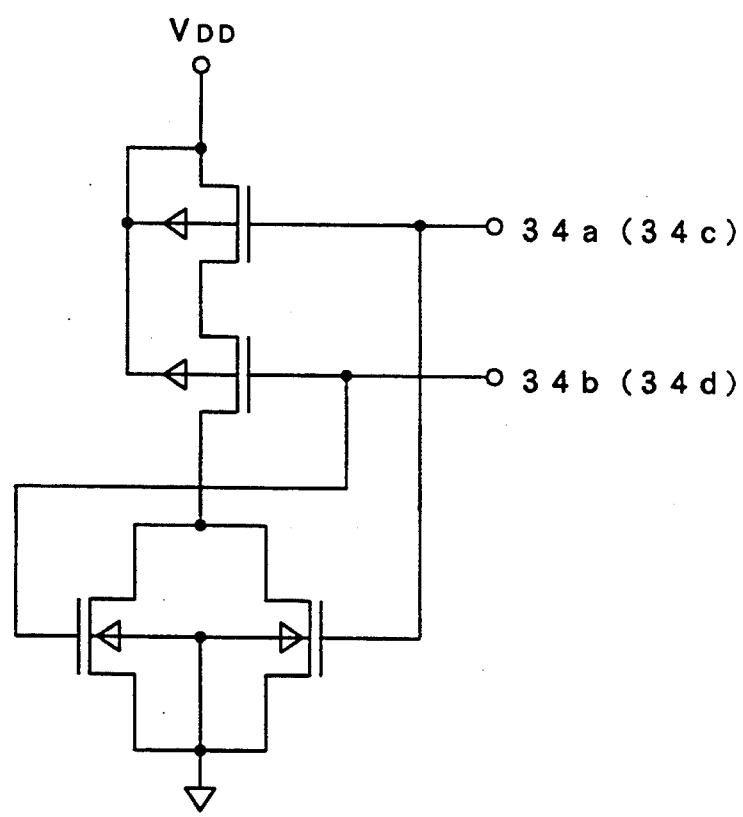
FIG. 9 is a circuit diagram of the semiconductor device shown in FIG. 7.

In addition, when an opening 50 is created after the step shown in FIG. 6D, and next subjected to the steps of FIGS. 2C–2F, 3 and 6, a semiconductor device seen in FIG. 8 can be obtained. The circuit shown in FIG. 9 is obtainable in the case where gate 34a is connected to gate 34c, and further, gate 34b is connected to gate 34d, respectively, at the step shown in FIG. 8.

Figure 10:
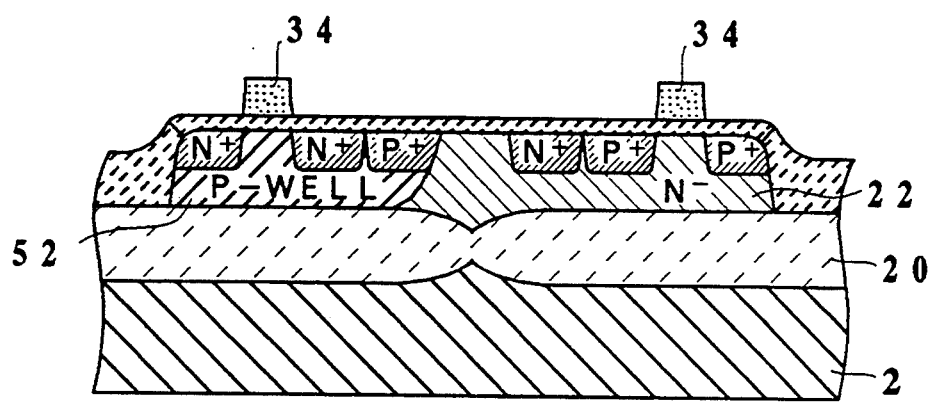
FIG. 10 is a view illustrating a structure to prevent the kink effect for the case where the epitaxially grown layer is thick.

Incidentally, in the above embodiment, the epitaxially grown layer 22 is so formed as to have a thickness of 50 to 100 nm. When the thickness of the epitaxially grown layer 22 is more than 100 nm, the kink effect concerning Io-Vo characteristics in MOSFET needs to be considered. In such a case, it is desirable to provide bias for both a P well region 52 and an N− epitaxial region 22 as shown in FIG. 10.

Figure 11:
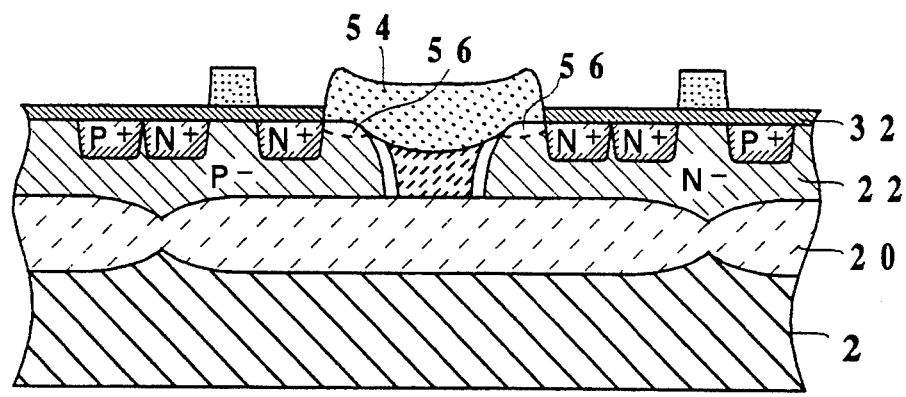
FIG. 11 is a view illustrating wiring between regions in the first layer.

Next, wiring to connect each region when forming a device having a three-dimensional structure as shown in FIG. 8 will be explained below. When a wiring is made between regions in the first layer, N-doped polysilicon 54 seen in FIG. 11 is employed, to thereby form an N-type region 56 in the contact layer thereunder.

Figure 12:
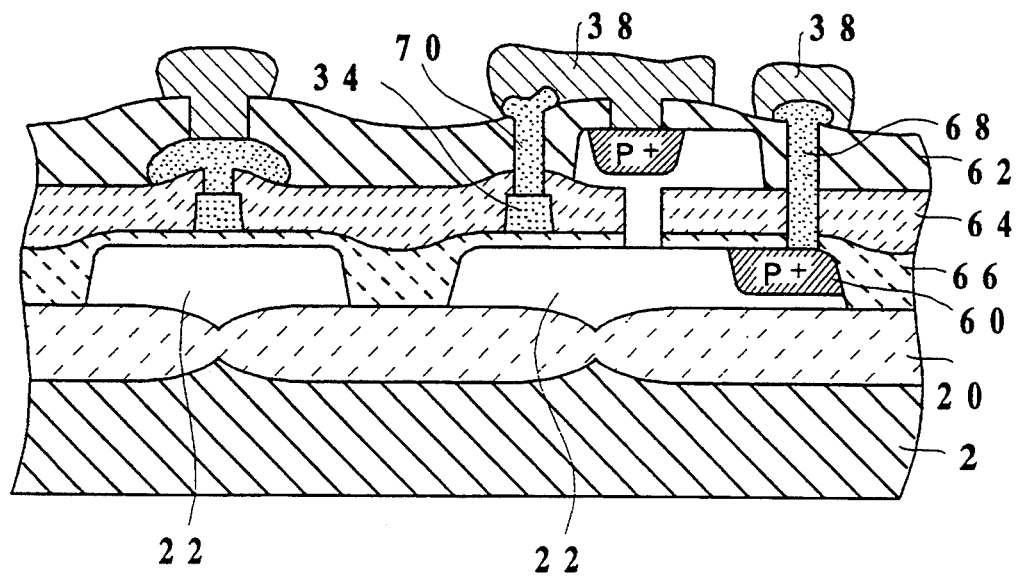
FIG. 12 is a view illustrating a wired structure into the second layer from the first layer.

Further, as shown in FIG. 12, with regard to the polysilicon contact 34 and the P+diffused layer 60 (N+diffused layer) in the first layer, it may be preferable to create them by etching insulating layers 62, 64 and 66 after upper layers are formed. However, as the contact area deepens, polysilicon buried plugs 68 and 70 may be favorably provided. The plugs are then subjected to an ion implant, to thereby be doped to either P-type or N-type.

In an embodiment shown in FIG. 8, semiconductor devices are formed in two layers. However, there may be three or more layers formed in a similiar manner.

In the method for manufacturing semiconductor device of the present invention, crystal growth is effected until the silicon seed crystal layer protrudes from the opening of the oxide insulating layer, thus obtaining silicon seed crystal layers having the same plane bearing. Moreover, after a barrier is formed on the surface of the silicon seed crystal layer, oxidation is carried out so that the silicon seed crystal layer in the opening is oxidized, in order to cut off the connection between the silicon seed crystal layer and the silicon substrate. Subsequently, the silicon layer, which is formed as regions isolated from one another, is grown out of the silicon seed crystal layer. As a result, a silicon grown layer can be obtained which is isolated from the silicon substrate and formed as regions isolated from one another, having a uniform plane bearing. In other words, the silicon grown layer can be formed without involving the pn junction with the silicon substrate, thus allowing the semiconductor device obtained to include a high-speed device. Also, the uniform plane bearing facilitates control during the formation of device components.

In the manufacturing methods of the present invention, after the oxide insulating layer is removed, oxidation is effected while leaving the seed crystal layer necessary for the crystal growth. As a result, barrier formation is not required, resulting in the improvement of productivity.

In the manufacturing methods of the present invention, after the opening formation step and before the seed crystal growth step, thin polysilicon layers or nitride silicon layers are formed on the oxide insulating layer of the opening sidewall. This arrangement serves to suppress any crystal faults to the opening sidewall from occurring during the crystal growth.

In the methods for manufacturing a semiconductor device of the present invention, the steps extending from insulating layer formation to device formation are repeated a specified number of times on the silicon grown layer on which a semiconductor device is formed, to thereby obtain the silicon grown layers insulated by a specified number of oxide insulating layers. As a result, a semiconductor device having a high degree of integration can be obtained in a three-dimensional structure.

In the methods for manufacturing a semiconductor device of the present invention, the step to form the insulating layer between growth layers is involved. Accordingly, the insulation between silicon growth layers is ensured, allowing the occurrence of parasitic circuit to be supressed.

Although the invention has been described in its preferred form with a certain degree of particularity, it is understood that the present disclosure of the preferred form has been changed in the details of its construction and any combination and arrangement of parts may be resorted to without departing from the spirit and the scope of the invention as hereinafter claimed.

What is claimed is:

1. A semiconductor device which comprises:
a) a silicon substrate having a surface;
b) an insulating layer formed on the entire surface of said substrate, said insulating layer including at least one bird's beak structure defined by a tapered connection formed between two portions of said insulating layer which have a substantially equal thickness which is greater than a thickness of said tapered connection therebetween;
c) a plurality of first growth layers of silicon on said insulating layer which plurality of first growth layers have a same crystal plane orientation as said substrate and are isolated from one another; and
d) a semiconductor element formed in each of said plurality of first growth layers.

2. A semiconductor device which comprises:
a) a silicon substrate having a surface;
b) an insulating layer formed on the entire surface of said substrate, said insulating layer including at least one bird's beak structure defined by a tapered connection formed between portions of said insulating layer which have a substantially equal thickness which is greater than a thickness of said tapered connection therebetween;
c) a plurality of first growth layers of silicon on said insulating layer which plurality of first growth layers having a same crystal plane orientation as said substrate and are isolated from one another;
d) a semiconductor element formed in each of said plurality of first growth layers; and
e) a second growth layer of silicon above a surface of each of said first growth layers, which second growth layer has a same crystal plane orientation as that of said substrate, said second growth layer further having a semiconductor element therein which is insulated from said plurality of first growth layers.

* * * * *